United States Patent [19]

Tucker

[11] 4,206,403
[45] Jun. 3, 1980

[54] APPARATUS FOR MEASURING THE FREQUENCY OF MICROWAVE SIGNALS

[75] Inventor: Trevor W. Tucker, Ottawa, Canada

[73] Assignee: Her Majesty the Queen, Ottawa, Canada

[21] Appl. No.: 918,945

[22] Filed: Jun. 26, 1978

[30] Foreign Application Priority Data

Mar. 14, 1978 [CA] Canada ............................. 299047

[51] Int. Cl.$^2$ ........................................... G01R 23/02
[52] U.S. Cl. ................................... 324/78 D; 324/95
[58] Field of Search ..................... 324/78 R, 78 D, 95

[56] References Cited

U.S. PATENT DOCUMENTS

| 3,763,431 | 10/1973 | Hopfer | 324/95 |
| 4,042,973 | 8/1977 | Caulfield | 324/78 D |

*Primary Examiner*—Michael J. Tokar
*Attorney, Agent, or Firm*—Larson, Taylor and Hinds

[57] ABSTRACT

It is known to measure the frequency of microwave signals by heterodyne conversion or by transfer oscillator techniques. Heterodyne conversion frequency counters are limited in their ability to measure the frequency of pulsed microwave signals. On the other hand, while transfer oscillator frequency counters can measure the frequency of pulsed microwave signals they have limitations in measuring signals with large frequency modulation components. The present invention utilizes analog microwave frequency dividing devices to virtually instantaneously convert the signal to be measured in octave steps into the frequency regimes associated with digital frequency counters. The apparatus disclosed comprises an antenna or other device for receiving a microwave frequency signal and feeding it to an analog frequency divider system having n stages, where n is an integer, each stage dividing frequencies applied to it by a factor of 2. The output of the divider system feeds a digital counter which, in turn, feeds a digital display device which displays a number equal to $2^n$ times the output of the digital counter and hence equal to the frequency of the received microwave signal.

2 Claims, 2 Drawing Figures

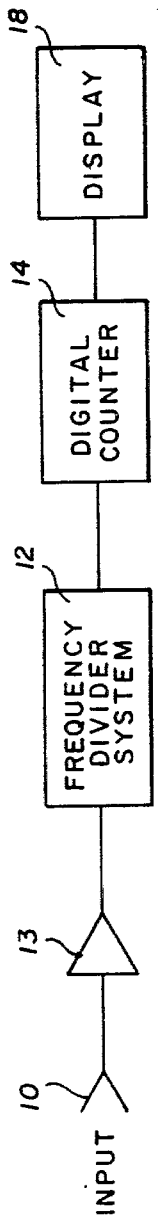
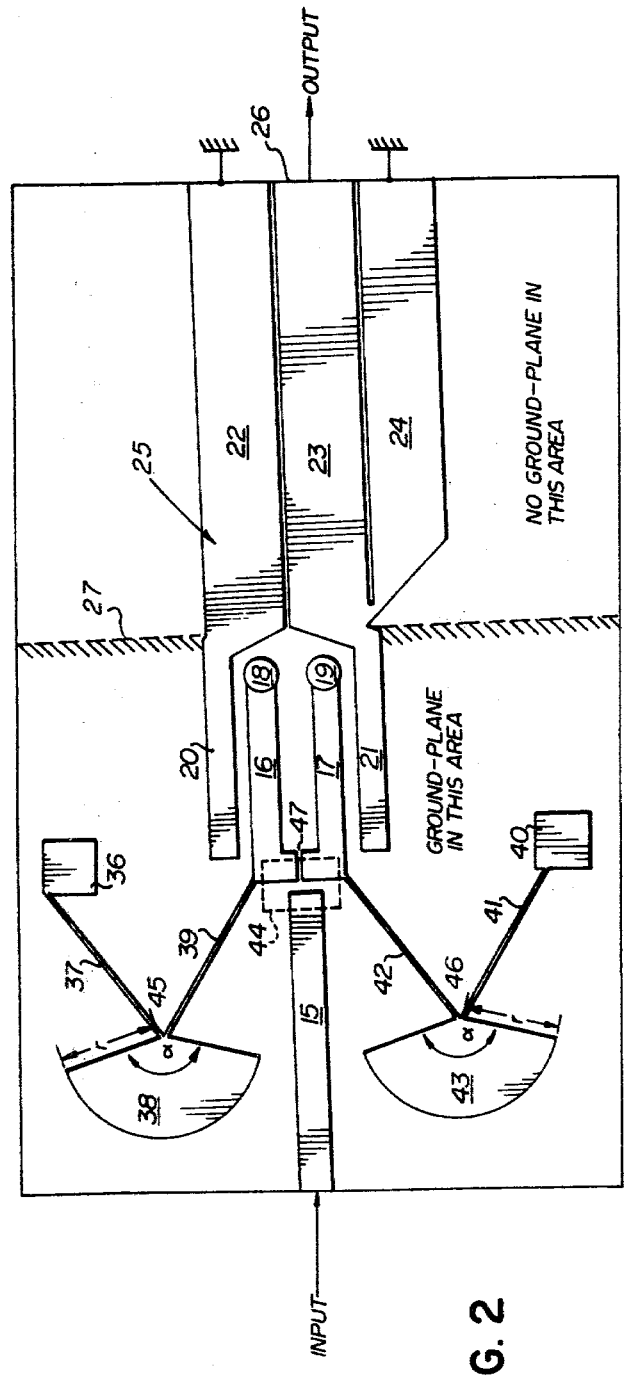

APPARATUS FOR MEASURING THE FREQUENCY OF MICROWAVE SIGNALS

This invention relates to apparatus for measuring the frequency of microwave signals.

It is desirable to be able to measure and display by automatic means the frequency of microwave signals which may be very short pulsed signals and/or microwave signals with large frequency modulation components. Presently, the frequency of microwave signals can be measured either by heterodyne conversion or by transfer oscillator techniques. These techniques are very well established and automatic microwave frequency counters utilizing both of these techniques are readily available on the commercial market. Both of these techniques rely for their operation on the mixing of the "$n^{th}$" harmonic of a local oscillator signal with the unknown input signal. The heterodyne converter frequency counter measures the resulting difference frequency, which is designed to be sufficiently low to be counted directly, by a digital counter. With the frequency of the local oscillator and the exact harmonic both known by design (or multiple measurements) the heterodyne converting frequency counter can then calculate and display the unknown input microwave frequency. The transfer oscillator, on the other hand, relies for its operation on tuning the local oscillator until the difference frequency (between the unknown input and the "$n^{th}$" harmonic of the local oscillator) is zero. The transfer oscillator frequency counter then directly measures, using a digital counter, the local oscillator frequency. Knowing the exact harmonic by design (or calculation using multiple measurements) the transfer oscillator frequency counter can then calculate the frequency of the unknown input signal. As well established (and described for example in Hewlett Packard Application Note 172: The Fundamentals of Electronic Frequency Counters) heterodyne conversion frequency counters are limited in their ability to measure the frequency of pulsed microwave signals. On the other hand, while transfer oscillator frequency counters can measure the frequency of pulsed microwave signals, they have limitations in measuring signals with large frequency modulation components.

The present invention utilizes analog microwave frequency dividing devices, in single or multiple cascaded stages to virtually instantaneously convert the unknown signal in octave (divide-by-two) steps into the frequency regimes associated with digital frequency counters. With the number of divide-by-two stages known and the frequency of the down-converted signal measured by a digital counter, the frequency of the unknown input signal can be automatically and digitally calculated and displayed.

According to the broadest aspect of the invention there is provided apparatus for measuring the frequency of microwave signals comprising means for receiving a microwave frequency signal and feeding it to an analog frequency divider system having n stages, where n is an integer, each stage dividing frequencies applied to it by a factor of 2, the output of the divider system feeding a digital counter which, in turn, feeds a digital display device which displays a number equal to $2^n$ times the output of the digital counter and hence equal to the frequency of the received microwave signal.

The analog frequency divider system is preferably such as disclosed in U.S. application Ser. No. 824,230, filed on Aug. 12, 1977, and entitled Broadband Frequency Divider Using Microwave Varactors this application corresponding to Canadian Pat. No. 1,041,614, issued Oct. 31, 1978. Prior to the development of such frequency dividers, it was not possible to provide microwave frequency division with adequate signal conversion characteristics such as, for example, turn-on time of frequency division, suppression of spurious signals, ability to divide frequency modulated (f.m.) signals and ability to convert frequency spectra with acceptable degradation.

The application will now be further described in conjunction with the accompanying drawings, in which:

FIG. 1 is a block diagram of apparatus according to the invention for measuring the frequency of microwave signals, and FIG. 2 is a diagram of an analog frequency divider which may be used in the present invention.

Referring to FIG. 1, the apparatus for measuring the frequency of microwave signals comprises means 10, e.g. an antenna, for receiving a microwave frequency signal and feeding it to an analog frequency divider system 12. The input signal may be fed through an amplifier 13, if considered necessary as will usually be the case. The analog frequency divider system has n stages, where n is an integer (including 1), each stage dividing frequencies applied to it by a factor of 2. The output of the divider system 12 feeds a digital counter 14 which, in turn, feeds a digital display device 18 which displays a number equal to $2^n$ times the output of the digital counter and hence is equal to the frequency of the received microwave signal at the input 10.

The display 18 is here assumed to include a multiplier for digitally multiplying the number at the output of digital counter 14 by the factor "$2^n$". Obviously a separate multiplier could be used.

Referring to FIG. 2, there is shown a diagram of an analog frequency divider which may be used in the frequency divider system 12 of FIG. 1. A microwave frequency signal at the input of frequency $f_1$ appears at the output as a signal of frequency $f_1/2$. A number of frequency dividers according to FIG. 2 may be connected in cascade, with intermediate amplifiers if necessary. Each stage divides the signal at its input by 2 so that if there are n stages, the ultimate output signal has a frequency of $1/2^n$ of the input frequency.

FIG. 2 is except for additional reference numerals, identical to FIG. 8 of the abovementioned U.S. patent application Ser. No. 824,230 and reference may be had to that application (or the aforementioned Canadian patent corresponding thereto.) for a more detailed discussion of the analog frequency divider. However, sufficient disclosure is included here for understanding of the present invention.

The frequency divider, which operates in the microwave frequency range, employs strip line or microstrip transmission lines, balanced varactor diodes and co-planar balun. The divider consists essentially of a basic resonant circuit which has two or more transmission lines, each such line being terminated with a varactor diode at one end of the line. The lines are electrically connected or electromagnetically coupled at the other end. The diodes are selected so as to be matched. Means are provided for introducing a signal to the basic resonant circuit and for extracting an output signal from the circuit. Strip lines, microstrip lines, varactor diodes and baluns are all known in the art and need not be explained here.

Referring to FIG. 2, the microstrip transmission line 15 carries an input electrical signal to microstrip transmission lines 16 and 17 through DC blocking chip capacitor 44 which is located between the microstrip line 15 and lines 16 and 17. At microwave frequencies, capacitor 44 is a short circuit.

Lines 16 and 17 are terminated with varactors 18 and 19. One terminal of each varactor is connected to an end of one of the transmission lines 16 and 17 and the other terminal is grounded by connection to the metallic ground plane of the microstrip transmission lines. It will be understood, of course, that the ground plane is on the underside of the device shown in FIG. 2 which is a top plan view.

The circuit comprising lines 16 and 17 and varactors 18 and 19 forms a basic resonant circuit which supports oscillation at ½ of the frequency appearing on input line 15 if the input signal on line 15 is approximately sinusoidal and if the length of lines 16 and 17 is appropriately chosen for the frequencies involved. The circuit is broadband in nature. For example, if the input signal contains frequency components ranging from 5–10 GHz and a desired output frequency range of 2.5–5 GHz were desired, then the circuit perameters would be chosen using the upper output frequency of 5 GHz as the approximate basic resonant frequency. (This is a small-signal resonant frequency). In summary, lines 16 and 17 and varactors 18 and 19 act in combination to form a sub-harmonic frequency generator with a balanced output signal.

The purpose of the balun 25 and coupling microstrip transmission lines 20 and 21 is to extract an output signal from the basic resonant circuit. Although FIG. 2 is here being discussed in terms of microstrip lines, it will be understood that strip lines and perhaps other types of lines may be used instead.

Open circuited microstrip transmission lines 20 and 21 are located adjacent to lines 16 and 17 of the basic resonant circuit and so a signal is induced by electromagnetic coupling into lines 20 and 21 from lines 16 and 17. The balanced signal appearing on lines 20 and 21 is conveyed to balun 25 and then to line 26 where it appears as an unbalanced output signal.

The significant result is the conversion of the balanced signal of a given input frequency to an unbalanced signal of an output frequency equal to half the input frequency. Ordinary care should be taken in the location and dimensioning of the circuit components, so that unwanted resonance and interference effects, etc., do not arise.

There is no ground plane in the balun section which lies to the right of line 27.

The generation of sub-harmonic frequencies is a result of the well known specific non-linear nature of the varactors 18 and 19 in the basic resonant circuit.

In general, the length of lines 16 and 17 will correspond to an electrical length somewhat less than $\lambda/4$ at resonance frequency. Routine experimentation may be used to determine appropriate dimensions. However, the device shown in FIG. 2 was designed to accommodate an input frequency range of 8.5 to 9.5 GHz. The microstrip line 15 may be used as an input matching transformer, in which case its impedance will be different from the normal 50 ohms and its length will be $\lambda/4$ at or near the center of the input band of frequencies. Further, capacitor 44 may be chosen to partially annul the inductive part of the input impedance. The input impedance of the basic resonant circuit looks inductive because the input frequency is in general higher than the resonance frequency.

DC bias is applied to the matched pair of varactors 18 and 19 by way of pads 36 and 40 which consist of layers of conducting material placed upon the surface of the substrate layers. The substrate may be alumina. An individual source of DC voltage may be applied to each pad or a common source may be applied to both pads 36 and 40. In either case, one terminal of a DC source is connected to (say) pad 36 and the other terminal of the DC source is connected to the ground conductive layer. Radial transmission lines 38 and 43 at operational microwave frequencies have zero or very small input impedances at points 45 and 46. Such radial or "half-moon" lines are discussed and partially analyzed by D. A. Syrett in a Master of Engineering Thesis at Carleton University in Ottawa, Canada, January, 1973, entitled "The Use of the Automatic Network Analyzer in the Development and Modelling of a Novel Broadband Bias Line for X-Band Microstrip Circuits". The optimum value of angle $\alpha$ is 150°. This value was not found by Syrett. The radius "r" of the "half-moon" lines is approximately a quarter of a wave length at the center frequency of the input band of frequencies. Transmission lines 37, 39, 41 and 42 have a physical length which is also ¼ of a wave length at the center frequency of the input band of frequencies. So, at point 47, the impedance looking back at radial lines 38 and 43 is substantially that of an open circuit or infinity. The impedance of the bias circuit at the output frequencies is irrelevant because, at resonance, point 47 is a virtual ground.

Two biasing circuits are provided to (1) preserve the overall symmetry of the device and (2) permit independent biasing of the two varactors to optimize the balance if necessary. In case (2), two separate blocking capacitors 44 would be used, one from 15 to 16, the other from 15 to 17. The electrical length of the co-planar balun is chosen to be $\lambda/4$ at the center of the output band of frequencies.

As shown in FIG. 2, the entire microstrip and co-planar balun circuit is intentionally skewed with respect to its substrate. This permits the input and output connectors to transmission line 15 and output point 26, being one end of arm 23 of the balun, to be located on the center line of a metal enclosure box which holds the entire device.

The resonance frequency $f_o$ of the device increases as the reverse DC bias is increased. This is because the average capacitance of the varactor changes with the bias voltage, as is known. The DC bias may be zero volts, although a DC return is required in order to prevent the varactors being charged and hence changing their capacitance.

For proper operation, the input power should be 15 dBm or greater.

It is believed that the foregoing description of FIG. 2 is sufficient to understand the present invention. For a more detailed explanation of the theory and operation of the frequency divider, reference should be had to the aforementioned U.S. patent application and Canadian patent.

Although the preferred embodiment has been described above as utilizing a particular form of microwave frequency divider it is expected that other types of microwave frequency dividers will be developed which would also function satisfactorily in apparatus according to the present invention.

The embodiments of the invention in which an exclusive property or privilege is claimed are defined as follows:

1. Apparatus for measuring the frequency of microwave signals comprising means for receiving a microwave frequency signal and feeding it to an analog frequency divider system having n stages, where n is an integer, each stage dividing frequencies applied to it by a factor of 2, the output of the divider system feeding a digital counter which, in turn, feeds a digital display device which displays a number equal to $2^n$ times the output of the digital counter and hence equal to the frequency of the received microwave signal.

2. Apparatus as claimed in claim 1 wherein each stage of the analog frequency divider system comprises: (a) an even number of matched microwave varactor diodes, each of said diodes having a first terminal and a second terminal; (b) a plurality of terminated microstrip transmission lines equal in number to the number of diodes, each of said plurality of terminated microstrip transmission lines comprising a first conductor and a second conductor, one end of the first conductor and one end of the second conductor defining a first end of the said last mentioned transmission line, and the other end of the first conductor and the other end of the second conductor defining a second end of the last mentioned microstrip transmission line, a one of each of said diodes terminating said second end of a corresponding one of said transmission lines by connecting said first conductor at said second end to said first terminal of said diode and connecting said second conductor at said second end to said second terminal of said diode; (c) an input microstrip transmission line coupled to said first end of all of said plurality of terminated transmission lines for conveying an input signal to said plurality of transmission lines; (d) a balun electromagnetically coupled to said plurality of microstrip transmission lines, said balun transforming a balanced signal from said plurality of microstrip transmission lines into an unbalanced output signal; (e) microstrip means positioned adjacent to said plurality of transmission lines and electromagnetically coupled therewith and electrically connected to said balun for conveying a signal from said plurality of lines to said balun.

* * * * *